United States Patent [19]
Parker et al.

[11] Patent Number: 5,534,442
[45] Date of Patent: Jul. 9, 1996

[54] PROCESS OF PROVIDING UNIFORM PHOTORESIST THICKNESS ON AN OPTO-ELECTRONIC DEVICE

[75] Inventors: James W. Parker, Stortford; Paul M. Harrison, Springfield; Robert G. Peall, Harlow, all of United Kingdom

[73] Assignee: Northern Telecom Limited, Montreal, Canada

[21] Appl. No.: 319,435

[22] Filed: Oct. 6, 1994

Related U.S. Application Data

[60] Continuation-in-part of Ser. No. 160,064, Nov. 30, 1993, abandoned, which is a division of Ser. No. 878,757, May 5, 1992, abandoned.

[30] Foreign Application Priority Data

May 10, 1991 [GB] United Kingdom ............... 9110155

[51] Int. Cl.⁶ .................. H01L 21/283; H01L 21/312; H01L 21/56; H01L 21/70
[52] U.S. Cl. ................. 437/2; 437/183; 437/231; 385/14
[58] Field of Search ................ 437/231, 183, 437/2; 385/14

[56] References Cited

U.S. PATENT DOCUMENTS

| | | | |
|---|---|---|---|
| 3,392,442 | 7/1968 | Napier et al. | 29/628 |
| 4,023,197 | 5/1977 | Magdo et al. | 357/71 |
| 4,892,374 | 1/1990 | Ackerman et al. | 385/14 |
| 4,904,036 | 2/1990 | Blonder | 350/96.11 |
| 5,021,866 | 6/1991 | Sudo et al. | 357/70 |
| 5,049,978 | 9/1991 | Bates et al. | 357/74 |
| 5,155,786 | 10/1992 | Ecker et al. | 385/94 |

*Primary Examiner*—Mary Wilczewski
*Assistant Examiner*—David E. Graybill
*Attorney, Agent, or Firm*—Lee, Mann, Smith, et al.

[57] ABSTRACT

A process for use in manufacturing opto-electronic components in opto-electronic hybrid module form. V-grooves (42) are provided by anisotropic etching techniques in a silicon substrate (41). Electrical ground planes (43) and interconnects (46, 49) are provided on dielectric layers (44, 50) with interconnections between them by way of vias (45, 51). Solder wettable pads (52) are provided on the outermost dielectric layer (50). Solder bumps (54) for use in a flip-chip bonding technique are provided by a wet forward technique. Components such as a laser array (30) are bonded to the solder bumps in accurate alignment therewith.

7 Claims, 5 Drawing Sheets

PROCESS OF PROVIDING UNIFORM PHOTORESIST THICKNESS ON AN OPTO-ELECTRONIC DEVICE

RELATED APPLICATIONS

This is a Continuation-in-Part application of application Ser. No. 08/160,064, filed Nov. 30, 1993, abandoned, which is itself a Divisional application of application Ser. No. 07/878,757, filed May 5, 1992, abandoned.

BACKGROUND OF THE INVENTION

This invention relates to opto-electronic components and in particular to processes for use in manufacturing high performance components in opto-electronic hybrid module form, especially silicon opto-hybrid form.

The advantages of optical interconnects in telecommunications systems have been thoroughly demonstrated. However, as the interconnect length reduces to tens of centimeters or less, such as in computer systems and referred to hereinafter, these advantages are harder to realise. One reason for this is that optical components have traditionally been packaged separately from electronic devices, which results in a relatively low density of integration. In order to increase interconnection capabilities, new ways of packaging optical, opto-electronic and electronic components will be required.

One approach is the monolithic integration of opto-electronic components, however the monolithic integration of arrays of laser with electronic multiplexer and logic circuits presents extreme technological difficulties which are unlikely to be overcome for some years.

Another possibility is to make use of hybrid multi-chip modules. Hybrid mounting techniques allow the independent optimisation of the individual optical and electronic components. For example, InP or GaAs lasers can be mixed with silicon integrated circuits and InGaAs or Si photodetectors. In this way complex and densely packed integrated opto-electronic subsystems can be manufactured which make the best use of each technology.

A particular application of opto-hybrid technology in multiprocessor mainframe computers is that of a wideband optical bus. This is an optical implementation of a time division multiplexed bus and is illustrated in FIG. 1. Each of a number of nodes (electronic circuit boards) 1, in this case eight nodes, are interconnected by central star coupler 2 and multi-element optical ribbon fibre cable 3. At each node there are array transmitter (4) and receiver (5) modules. The whole acts as a broadcast network; all the data transmitted at one node is received by all the others. The basic network shown could operate at up to 32 Gbit/s and multiple instances would be combined in parallel to achieve the overall throughput required. It will be appreciated that this is only an example. There are many other applications in computers, telecommunications systems and elsewhere.

A number of components are required to build such a network; array transmitter and receiver modules, the passive optical star coupler and optical ribbon fibre cable. Attention is directed to our co-pending GB Application No 8925539.2 (Serial No 2237949) (J. W. Parker 5) which relates to various aspects of such a network, in particular the coupler and the transmitter and receiver modules and discusses realisations of the latter in silicon opto-hybrid form, which form can achieve the necessary compactness and reliability at a reasonable cost.

The layout of a transmitter module 4, is shown schematically in FIG. 2. Each module comprises a twelve element laser array 6, a twelve element laser driver array 7 and a twelve element MUX array 8 whereby several lower speed inputs can be combined into one data stream. Fifteen parallel low bit rate data inputs are indicated at 9 but in practice the number may be very much higher. Ten of the twelve outputs A (ten of fibres) are data outputs at say 3.2 Gbit/s, whereas one of the other outputs is used to transmit a common clock and the other is for control purposes, such as for transmitting parity information. Electrical interconnects are not shown in FIG. 2, but will for example be at B. The light from the rear facet of the laser array is monitored by an array of backface detectors (not shown in FIG. 2) whose output signals provide a bias to the respective laser driver to ensure that the lasers are kept at threshold. The output from the lasers is coupled into the ribbon fibre 3 either directly or by the use of ball lenses. The receiver module has a similar form of layout to the transmitter and can be fabricated by identical technology.

A basic transmitter module in silicon opto-hybrid form is described in GB Application No 8925539.2 (Serial No 2237949) and is shown in FIG. 3. For simplicity and clarity only one laser, one fibre and the associated driver and multiplex chips are shown. The electrical connections are omitted. The module involves a silicon substrate 20 in which a V-groove is provided. In the case of a (100) silicon substrate anisotropic etching using etching techniques mentioned hereinafter will produce V-shaped wells with the plane side walls formed by the (111) planes. With appropriate masking the groove can be made open at one end for reception of the fibre 19 and closed at the other end as indicated. Also etched in the substrate and aligned with groove 21 is a well 21' with an inclined end wall which provides a reflector, that can be metallised to improve reflectivity as can the well walls adjoining it, whose purpose will be apparent from the following. Mounted in alignment with the groove 21 and well 21' is a laser chip 23. The depth of the groove is such that the core of the fibre 19 is aligned with the output of the laser chip 23. The laser chip 23 has its electrical contacts on its face adjacent the substrate, as have the driver/multiplexer chips 24 and 25, which may be of silicon or gallium arsenide. These chips are electrically and thermally contacted to the substrate 20 using bumps of solder on photolithographically defined pads. This is by the so-called self-aligned solder bump technology in which surface tension pulls the chips into alignment to an accuracy of the order of 0.5 μm. The photolithographically defined pads form part of the electrical connections referred to above which may involve one of the so-called HDI (high density electrical interconnect) technologies, for example interconnects using multiple level of polyimide and a metal. A monitor photodiode chip 26 is mounted to monitor the output from the back face of the laser chip 23. This chip 26 too has its electrical contacts on its face adjacent the substrate and also its active area which performs detection. The side walls and end inclined wall of the well 21' serve to reflect light output from the back face of the laser chip to the active area. The receiver module is similar to the transmitter module. In that case the laser chip is omitted and the V-groove extends part way under the photodetector chip, corresponding to the monitor photodiode. The chips 24 and 25 would in this case comprise demultiplexer and other functions required at the receiver module.

One of the aims of the present invention is to provide a practical process for producing the modules referred to above.

SUMMARY OF THE INVENTION

According to one aspect of the present invention there is provided a process for providing solder bumps for use in a flip-chip bonding technique, comprising the steps of providing a solder-wettable pad at a non-wettable substrate, defining a solder element on the pad and within the pad's circumferential edge, heating the arrangement whereby to melt the solder for reflow thereof, the molten solder being such as to flow to the edge of the wettable pad and cover the entirety thereof, and cooling the arrangement thereby forming a said bump.

According to another aspect of the present invention there is provided a process for manufacturing opto-electronic hybrid modules and including the steps of forming V-grooves in one surface portion of a silicon substrate for reception of optical fibres or for other features, depositing an electrically conducting ground plane over the substrate including the grooves, depositing a first dielectric layer on the ground plane, forming vias in the first dielectric layer, defining an electrical interconnect pattern on the first dielectric layer which is in contact with the ground plane via the vias, depositing a second dielectric layer on the first dielectric layer and interconnect pattern, forming vias in the second dielectric layer whereby to expose the interconnects and the ground plane, depositing solder-wettable material in the vias in the second dielectric layer whereby at least to provide solder-wettable pads at positions where solder bumps for use in flip-chip bonding of opto-electronic components are to be formed, defining solder elements on said pads, reflowing the solder elements whereby to form solder bumps thereat, disposing said opto-electronic components having corresponding solder-wettable pads on said solder bumps, heating the arrangement to melt the solder, surface tension forces causing accurate alignment of the opto-electronic components and the processed substrate.

Preferably the arrangement of the V-grooves in relation to other photolithographically defined features is such that the grooves are confined to a region beyond a restricted area of the substrate that circumscribes these other photolithographically defined features. This facilitates photolithographic processing subsequent to the etching of the V-grooves by providing a relatively flat area over which the thickness of a centrifugally spread layer of photoresist is unaffected by disturbed flow patterns created by flow in and around the grooves.

According to another aspect of the present invention there is provided a process for providing a laser array with solder-wettable pads in a step which simultaneously isolates the lasers of the array from one another, including the steps of providing an Au/Pt/Ti layer on an oxide layer on the array, defining a mask to delimit Au/Pt/Ti solder-wettable pads, removing the Au/Pt layer except by said pads by ion beam milling, adding $SF_6$ to remove the corresponding Ti, and using the resultant mask for reactive ion etching of the underlying oxide, underlying quaternary material being subsequently wet etched.

BRIEF DESCRIPTION OF THE DRAWINGS

Embodiments of the invention will now be described with reference to the accompanying drawings, in which.

DESCRIPTION OF THE PREFERRED EMBODIMENTS

Figure 4:
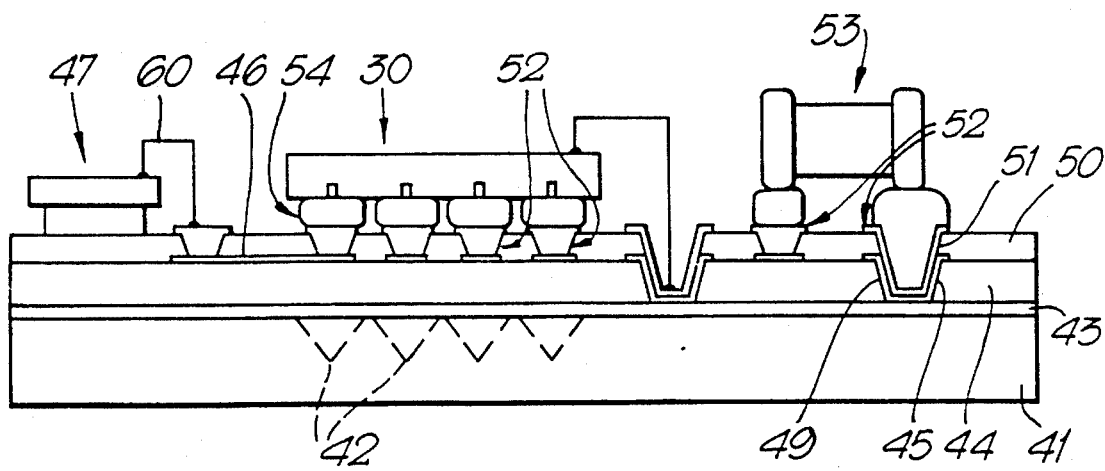
FIG. 4 illustrates in cross-section a transmitter module manufactured by a process according to the present invention.
Figure 5:
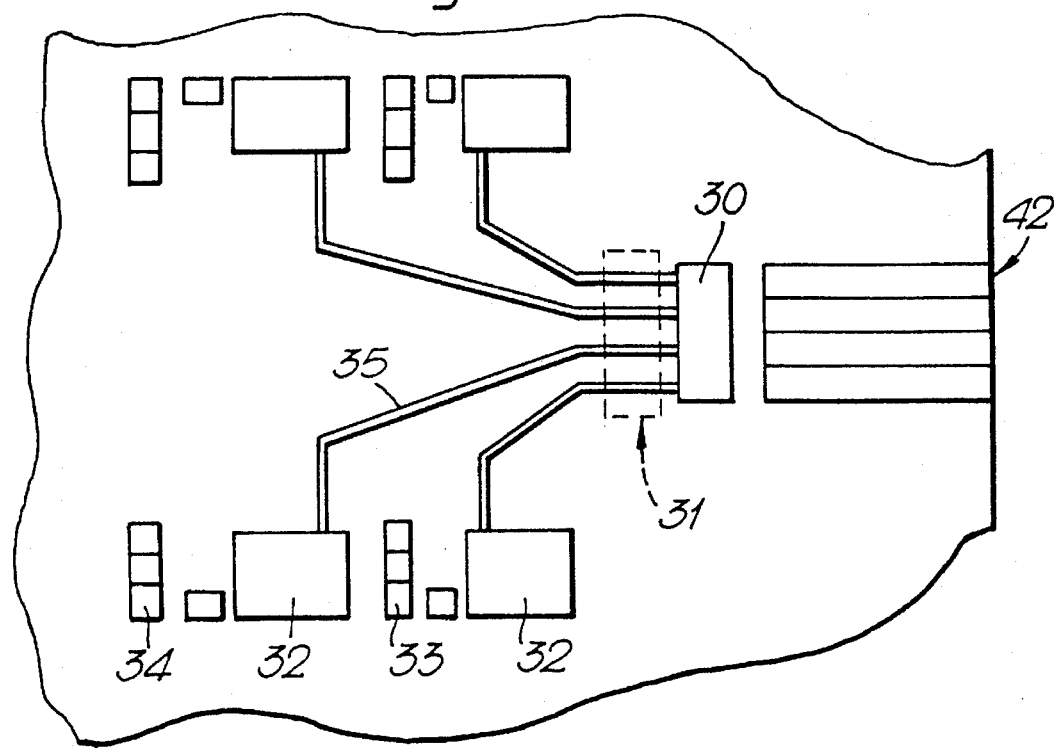
FIG. 5 illustrates schematically a plan view of a transmitter module manufactured by a process according to the present invention.
Figure 6A:
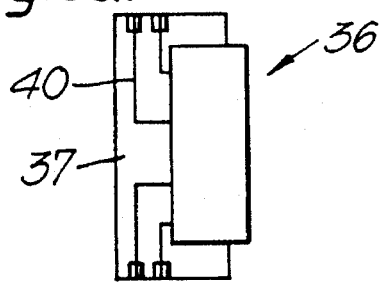
FIGS. 6a and 6b show in plan view and section, respectively a backface photodetector array which is mounted at the position indicated by the dotted box in FIG. 5.
Figure 6B:
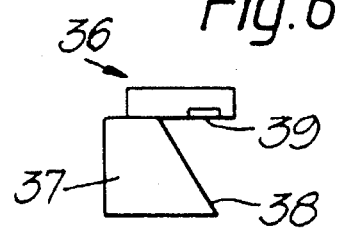

The transmitter module illustrated in FIGS. 4 to 6 is a silicon opto-hybrid module. Silicon possesses a unique combination of properties as a substrate material for opto-hybrid modules. It has excellent mechanical stability and thermal conductivity. Its thermal expansion coefficient matches that of silicon integrated circuits mounted on it and corresponds more closely to that of GaAs and InP than the ceramic, copper or diamond headers conventionally used. This results in a reduction in the stress induced during bonding and is particularly important for laser arrays which can fail to operate if the laser stripe is subject to significant stress.

The illustrated module of FIGS. 4 to 6 has only four optical fibres, lasers, drivers etc. for the sake of simplicity, but the processing to be described hereinafter is not to be considered as so limited. Furthermore single laser drivers are shown in FIGS. 5 and 6 whereas the lasers and backface detectors are provided in the form of arrays 30 and 36. The laser driver integrated circuits 32 have associated passive components such as capacitor 33 and resister 34. Only some of the interconnection tracks, namely those 35 to the laser drivers, are indicated in FIG. 5. The backface detectors comprise a PIN photodetector array 36 mounted on an etched silicon submount 37, the angled surface 38 reflecting light to the active areas such as 39 of the array. The submount has respective conductive tracks 40 whereby the detectors can be connected to the respective laser drivers. The submount is mounted in place at the position indicated by the dotted box 31 in FIG. 5 so that light from the backface of the laser array is incident thereon.

The processing steps to achieve the module construction whose cross-section is illustrated in FIG. 4 will now be described. The starting material is a standard silicon substrate 41. V-grooves 42, which are to locate the fibres, are provided at the required location on the substrate 41 by the well-established anisotropic etching technique. For example, a 1000 Å layer of $Si_3N_4$ is deposited on the surface of the substrate 41. The nitride layer is then patterned by using reactive ion etching (RIE) in Freon 14/8% oxygen using a photoresist layer as a mask. As a result the nitride is removed in selected areas where the V-grooves are to be provided. The photoresist is removed and the V-grooves etched in the silicon using a suitable etchant such as KOH diluted in IPA and water, etching being carried out at 80° C. A suitable, solution comprises 6 liters of deionised water, 2 liters of IPA and 1.5 kg of KOH. This attacks the (100) surfaces preferentially producing the V-grooves 42 with side walls in the (111) plane. The widths and depths of the V-grooves 42 formed in this way can be controlled to less than a micron. Since the etch mask is defined photolithographically, the grooves can be positioned to submicron accuracies with respect to other features, for example the bond pads of opto-electronic components to be described hereinafter.

Following etching of the V-grooves 42, the remaining nitride film is removed such as by using the same reactive ion etcher referred to above for patterning it. A Cr/Au ground plane 43 is then deposited on the substrate surface containing the grooves by evaporation of 300 Å Cr and 0.51 µm Au. This is then patterned photolithographically and wet etched using Kl/l in order to remove it from areas where a ground plane is not required, such as under the laser array. The Cr/Au is left in the V-grooves 42 as a protection layer for reasons which will be apparent in the following description. Following removal of the ground plane resist, a 2 micron layer of silicon dioxide dielectric 44 is deposited such as by PE CVD. This is then patterned photolithographically and etched to give via holes 45 down to the ground plane 43 where required. Vias with sloping sidewalls can be achieved by RIE using an erodable resist mask together with gases such as Freon 23 and oxygen. That resist is then removed and the wafer patterned for interconnects using a resist/lift off pattern. The interconnects 46 and 49 are of deposited layers on one another of Cr, Cu and Au, being 300 Å, 0.5 micron and 2000 Å thick respectively, for example. The interconnects 46 extend between the integrated circuits (drivers) such as 47 and a respective laser of the array 30, see also FIG. 5, and also form contact layers 49 through the via holes 45 down to the ground plane 43. The associated resist is then removed and a second layer 50 of silicon dioxide deposited on the wafer surface and patterned in a similar manner to the first but using an appropriate mask, in order to open up via holes 51 through to the Cr/Au ground plane 43 and through to the Cr/Cu/Au interconnects.

Using appropriate lift-off photolithographic patterning successive layers of Ti, Pt and Au are deposited to form wettable pads 52 for the laser array in the via holes corresponding thereto and in any other vias in order to make interconnects for any passive components such as 53 and the integrated circuit such as 47. The resist is then removed and a Au/Sn solder deposited over the whole surface. An 80% Au 20% Sn composition is currently preferred (melting point 280° C.) and this can be applied using a multilayer deposition process, alternate layers of Au and Sn, to give the required 80/20 composition. This AuSn solder layer is patterned photolithographically and wet etched using 2:1 HNO$_3$:HCl. The AuSn solder is only required in the vicinity of the wettable pads i.e. at 54 and is to be employed in bonding the laser array in place by a solder bump technology.

Figure 7A:
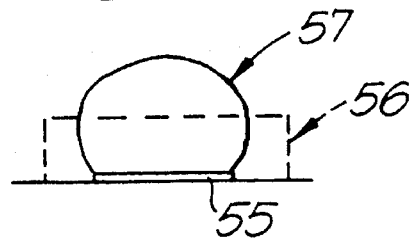
FIGS. 7a and 7b illustrate the wet-back and wet-forward processes respectively.

Conventional solder bump technology involves a wet back technique, see FIG. 7a, with a wettable pad 55 on a non-wettable substrate. A solder layer element 56 (dotted lines) is defined which extends beyond the edges of the wettable pad 55. This element is reflowed to make a solder bump 57 which only extends over the wettable area i.e. wettable pad 55. This is known as a wetback process since the solder flows "back" to the edges of the pad during reflow because the substrate is non-wettable.

Figure 7B:
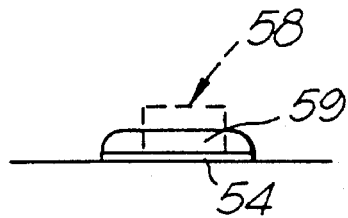

We, however, propose the use of a wetforward technique for providing solder bumps for use in flip-chip bonding. The AuSn solder layer is patterned so that the solder layer element 58 FIG. 7b as defined photolithographically is smaller than the wettable pad 54 on which it is disposed. When this element 58 is reflowed to make a bump 59 it spread out over the entire wettable pad i.e. it flows forward (wetforward). The use of 2 HNO$_3$/HCl to etch the AuSn results in an oxide border around the solder element. This oxide must be removed as it will restrict the reflow of the solder and hence the self-aligning process. This oxide removal can be achieved by etching the wafer for 20 minutes with an etchant comprised of 60 g KOH in 100 ml water. The silicon V-grooves are protected from this etchant by the Cr/Au, which was specifically not removed therefrom during the ground plane definition process. This etchant cleans up the exposed surface of the solder elements so that a fluxless reflow of the solder elements to produce the required solder bumps can be employed. Such reflow is carried out in an inert atmosphere for example of hydrogen or nitrogen. The thickness of the deposited AuSn must clearly be sufficient to achieve wetforward and a sufficient bond in the completed module. A laser array 30 is subsequently bonded to the solder bumps. The array is provided with corresponding metallisation i.e. wettable pads of Ti/Pt/Au and when the array is positioned with the metallisation aligned with the solder bumps and the assembly raised to the melting point of the AuSn solder the solder wets the wettable pads of the laser array and surface tension forces pull the two components into a very accurate final alignment. The passive components are bonded in position using either solder or a conductive epoxy whereas the drive integrated circuit is mounted using epoxy. Wire bond interconnections such as those indicated at 60 can be made to complete the necessary interconnections. The PIN photodetectors array 36 is mounted to the silicon submount 37 using the same wetforward technique with AuSn solder and Ti/Pt/Au wettable pads. The silicon submount 37 is mounted in the required position at 31 relative to the back face of the laser array.

The laser arrays are manufactured by a process which is such that the individual laser isolation and the wettable pads are formed by a single self-aligned photolithographic stage. An Au/Pt/Ti layer is provided. The photoresist mask is defined and then the Au/Pt layer on the array is removed using Xenon ion beam milling. In the last stages of this etch SF$_6$ is added to remove the underlying Ti. Using this as a mask the underlying oxide is removed by RIE in Freon 23 and oxygen and finally the quaternary layer is removed by wet etching in 3 phosphoric acid: 1 HCl. Any resist is then removed.

The use of a wet forward process as described above is advantageous since there is no possibility of droplets and debris being left outside of the wettable pad area as in the case of the wetback process, which droplets/debris could cause erroneous operation or failure of the module. With the wet-forward process the solder moves as a wave to the edge of the wettable pad, engulfing anything in its path, although there should not be any such material there if the processing is carried out correctly. Wetforward processing results in a very well defined solder bump with sharp edge around the wettable pad, as the solder runs right out to the edge. With a pulling back process the effect may not be symmetrical all round the pad. The wetback process means that "thin" solder layers are put down whilst a thick solder bumps results after reflow. With a wetforward process the resultant solder bump will actually be less high than the deposited solder layer. In the present case the deposited layer is required only to be approximately 5 µm for wetforward and such thicknesses can readily be achieved. Conventional wetback techniques with SnPb solder generally form 10–20 µm high bumps.

Figure 1:
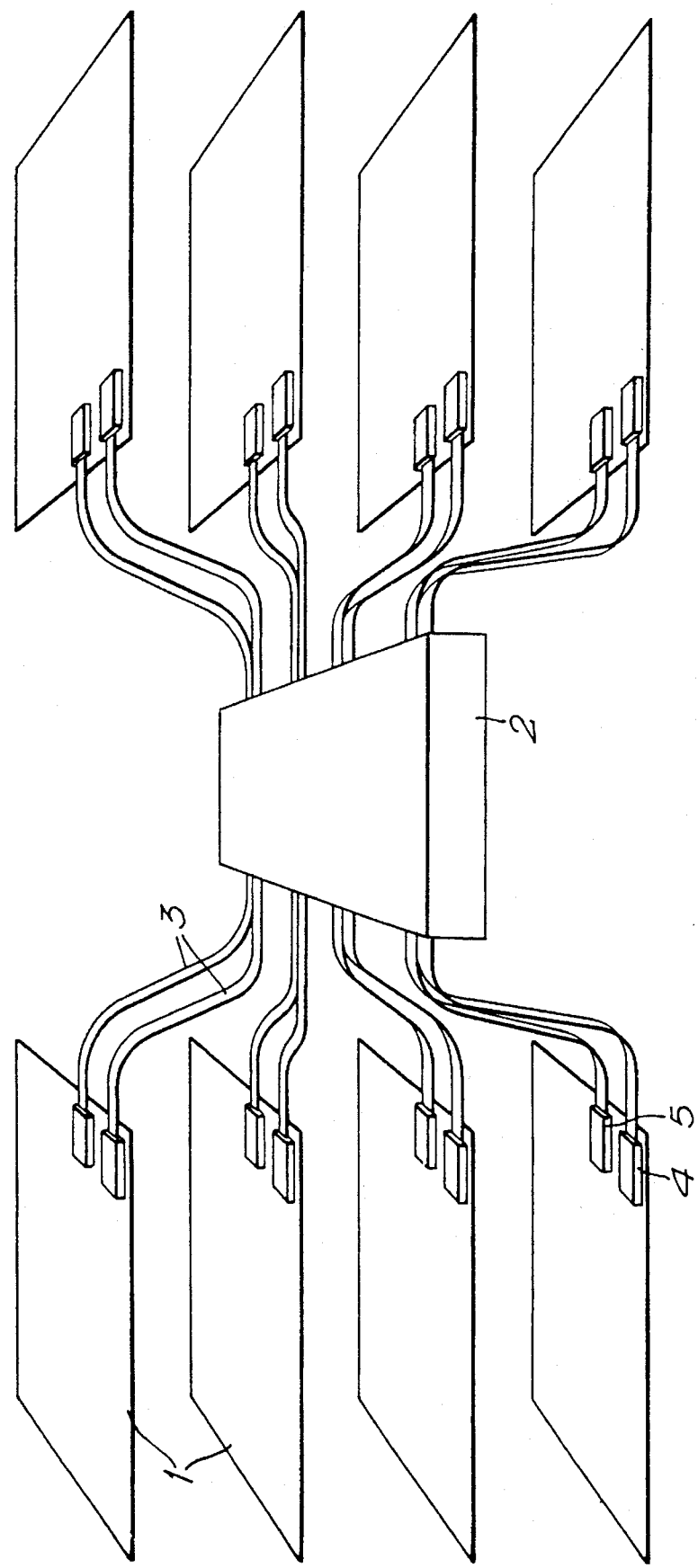
FIG. 1 illustrates a 32 Gbit/s optical bus based on passive star couplers.
Figure 2:
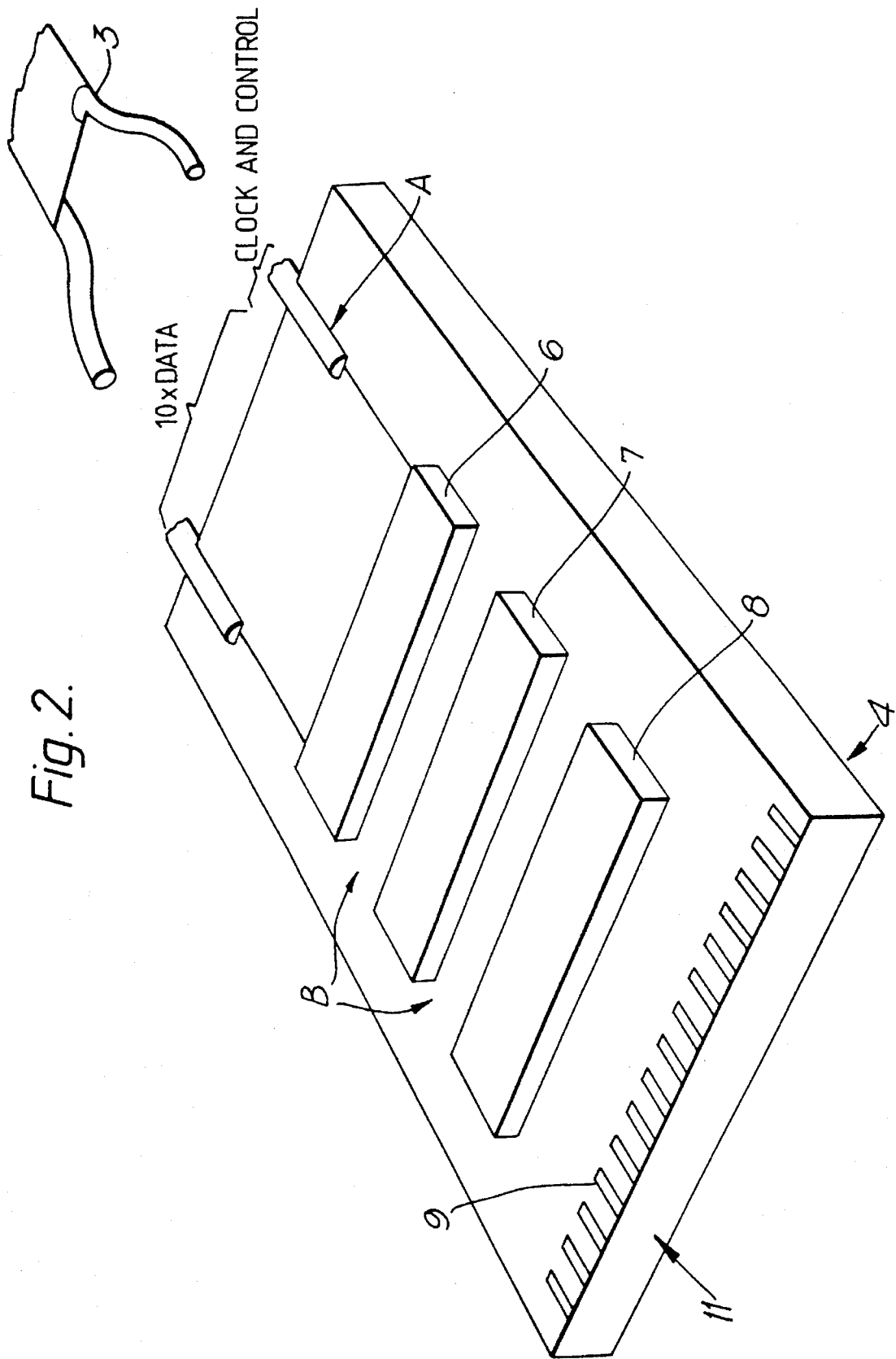
FIG. 2 illustrates a basic array transmitter module.
Figure 3:
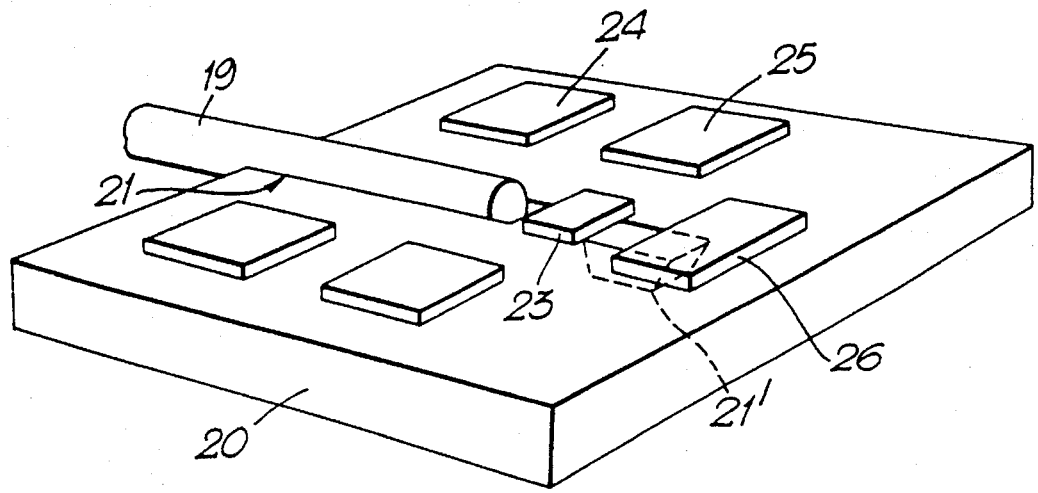
FIG. 3 illustrates a basic single fibre transmitter module.

One of the features that may be noted about the layout of FIG. 3 is that its V-grooves 21 and 21' are situated in amongst the arrangement of the laser chip 23 the driver/ multiplexer chips 24 and 25, and the monitor photodiode chip 26. Using the processing described above with particular reference to FIGS. 4 and 5 to create a layout as depicted in FIG. 3 has been found to result in problems of impaired reliability and yield. It is believed that this arises from the fact that the photolithographic processing required to create the electrical conductors of the multilayer circuit and the required inter-layer electrical insulation is performed on a substrate that is not substantially flat, but has one or more relatively deeply etched features in its surface. It is believed that these features interfere with high quality photolithographic processing by disrupting the smooth flow of photoresist materials as they are centrifugally spread by spinning of the substrate, creating zones of differing thickness in the wake of the flow of resist in the neighbourhood of such features. Such absence of uniformity restricts the satisfactory positioning and resolution of patterning obtainable from these photoresist layers.

Figure 8:
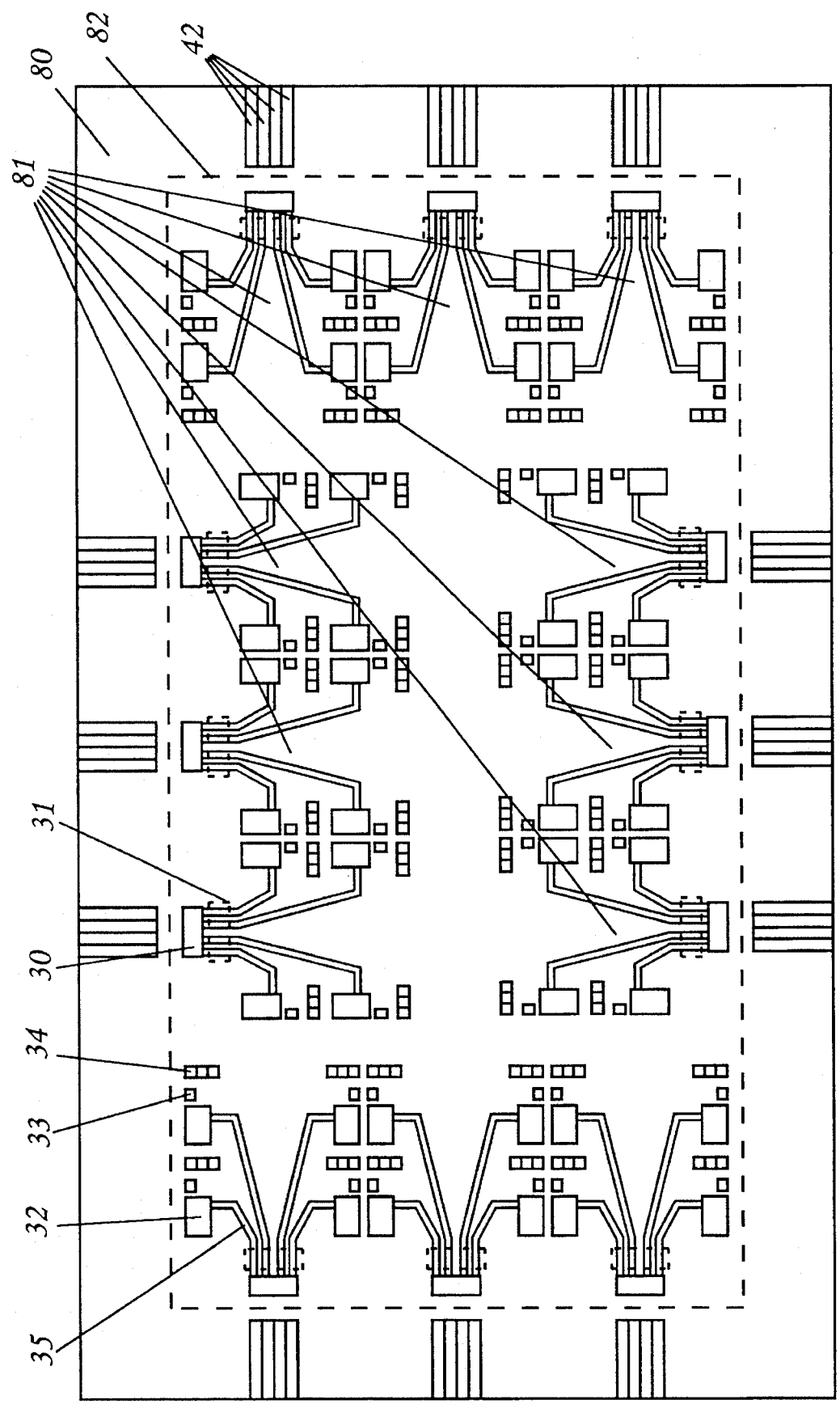
FIG. 8 illustrates schematically a plan view of a plurality of the transmitter modules of FIGS. 4 and 5 manufactured on a common single crystal substrate.

This problem may be circumvented by avoiding layouts like that of FIG. 3 with its grooves lying in amongst the various components and electrical interconnections, instead choosing to separate them so that the grooves are confined to regions beyond a restricted area of the substrate that circumscribes these components and electrical interconnections. The presence of the grooves still disrupts the smooth flow of resist, but such disruption occurs only in the regions beyond the confines of the restricted area. Hence, within this restricted area the flow of resist is smooth and, in consequence, its thickness substantially uniform. It may be particularly noted that the layout of FIGS. 4 and 5 is itself an example of a layout providing the requisite separation. FIG. 8 depicts a substrate 80 on which are formed twelve transmitter modules 81 of the general configuration of that of FIGS. 4 and 5, these being arranged to provide a restricted area indicated by broken outline 82 circumscribing all the electrical interconnections 35 and various components comprising laser arrays 30, PIN detector submount positions 31, laser driver integrated circuits 32, capacitors 33, resistors 34 and electrical interconnection tracks 35. Within the area circumscribed by this broken outline the substrate 80 is smooth and in consequence photoresist applied within this area can be centrifugally spread to create a resist layer of substantially uniform thickness while, outside this area, the presence of the grooves 42 disrupts the smooth flow, resulting here in a resist layer of significantly non-uniform thickness.

We claim:

1. A process for manufacturing opto-electronic hybrid modules and comprising the steps of forming V-grooves in one surface portion of a silicon substrate for reception of optical fibres or for other features, depositing an electrically conducting ground plane over the substrate including the grooves, depositing a first dielectric layer on the ground plane, forming vias in the first dielectric layer, defining an electrical interconnect pattern on the first dielectric layer which electrical interconnect pattern is in contact with the ground plane via the vias, depositing a second dielectric layer on the first dielectric layer and electrical interconnect pattern, forming vias in the second dielectric layer depositing solder-wettable material in the vias in the second dielectric layer whereby at least to provide solder-wettable pads at positions where solder bumps for use in flip-chip bonding of opto-electronic components are to be formed, defining solder elements on said pads, reflowing the solder elements to form solder bumps thereat, disposing said opto-electronic components having corresponding solder-wettable pads on said solder bumps, heating the arrangement to melt the solder, surface tension forces causing alignment of the opto-electronic components and the processed substrate which processing steps include the application of photoresist to the substrate in a region from which it is centrifugally spread over the surface of the substrate by the spinning of the substrate, wherein the layout of the modules is such that profiles, including said grooves, that disrupt the smooth flow of said centrifugal spreading of the photoresist are excluded from an area of the substrate that circumscribes said vias in the first dielectric layer, said electrical interconnect pattern, said vias in the second dielectric layer, and said solder wettable pads whereby, within said area substantial uniformity of thickness of the centrifugally spread photoresist is ensured.

2. A process as claimed in claim 1 further including the steps of mounting lasers,, laser driver integrated circuits, backface photodetector arrays and passive components to the processed substrate.

3. A process as claimed in claim 2 wherein the solder elements are reflowed in a wet-forward manner.

4. A process as claimed in claim 1 wherein the solder elements are reflowed in a wet-forward manner.

5. A process as claimed in claim 1 wherein the ground plane is of Cr/Au, and wherein the solder-wettable material is of Ti/Pt/Au.

6. A process as claimed in claim 5 further including the steps of mounting lasers, laser driver integrated circuits, backface photodetector arrays and passive components to the processed substrate.

7. A process as claimed in claim 6 wherein the solder elements are reflowed in a wet-forward manner.

\* \* \* \* \*